(12) United States Patent
Song et al.

(10) Patent No.: US 7,659,662 B2
(45) Date of Patent: Feb. 9, 2010

(54) ELECTROLUMINESCENCE DISPLAY DEVICE WITH MICROLENS

(75) Inventors: Young-Woo Song, Suwon-si (KR);
Yoon-Chang Kim, Suwon-si (KR);
Jong-Seok Oh, Suwon-si (KR);
Sang-Hwan Cho, Suwon-si (KR);
Ji-Hoon Ahn, Suwon-si (KR); Joon-Gu Lee, Suwon-si (KR); So-Young Lee, Suwon-si (KR); Jae-Heung Ha, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 482 days.

(21) Appl. No.: 11/358,132

(22) Filed: Feb. 22, 2006

(65) Prior Publication Data

US 2006/0192485 A1 Aug. 31, 2006

(30) Foreign Application Priority Data

Feb. 28, 2005 (KR) .................. 10-2005-0016888

(51) Int. Cl.
*H05B 33/00* (2006.01)
*H01J 1/62* (2006.01)

(52) U.S. Cl. .................. 313/506; 313/504; 428/690

(58) Field of Classification Search ......... 313/501–512, 313/498; 428/690
See application file for complete search history.

(56) References Cited

U.S. PATENT DOCUMENTS

| 5,869,929 | A * | 2/1999 | Eida et al. .................. 313/501 |
| 6,181,062 | B1 * | 1/2001 | Hiraishi et al. .............. 313/504 |
| 6,819,043 | B2 * | 11/2004 | Lee et al. .................... 313/506 |
| 6,984,934 | B2 * | 1/2006 | Moller et al. ................ 313/504 |

| 2001/0033135 | A1 * | 10/2001 | Duggal et al. ............... 313/506 |
| 2003/0141805 | A1 | 7/2003 | Lee et al. |
| 2004/0061136 | A1 * | 4/2004 | Tyan et al. .................. 257/200 |

(Continued)

FOREIGN PATENT DOCUMENTS

CN 1561149 1/2005

(Continued)

OTHER PUBLICATIONS

Chinese Office Action dated Sep. 5, 2008.

*Primary Examiner*—Sikha Roy
(74) *Attorney, Agent, or Firm*—H.C. Park & Associates, PLC

(57) ABSTRACT

An electroluminescence (EL) display device is disclosed with a microlens layer positioned between a light-emission layer and a color converting layer or a color filter layer. The microlens layer can be formed separately or integrally with an electrode of the EL display device. Light emitted from the light-emitting layer passes through an electrode and then through the microlens layer, which has a higher refractive index than the electrode to focus light in a predetermined direction. The light then passes through the color converting layer or a color filter layer to emit red, green, or blue light from the device. The microlens layer and color converting layer or color filter layer can be disposed for either active matrix or passive matrix, and for either a top-emission type, bottom-emission type, or dual emission type EL display device for improved external light coupling efficiency and brightness.

16 Claims, 5 Drawing Sheets

U.S. PATENT DOCUMENTS

| | | | |
|---|---|---|---|
| 2004/0150329 A1* | 8/2004 | Asai et al. | 313/506 |
| 2004/0245918 A1* | 12/2004 | Lee | 313/503 |
| 2005/0093435 A1* | 5/2005 | Suh et al. | 313/504 |

FOREIGN PATENT DOCUMENTS

| | | |
|---|---|---|
| CN | 1575056 | 2/2005 |
| JP | 04-192290 | 7/1992 |
| JP | 07-037688 | 2/1995 |
| JP | 10-172756 | 6/1998 |
| JP | 11-008070 | 1/1999 |
| JP | 11-074072 | 3/1999 |
| JP | 2000-322000 | 11/2000 |
| JP | 2002260845 A * | 9/2002 |
| JP | 2003-086353 | 3/2003 |
| JP | 2004-127560 | 4/2004 |
| JP | 2004-127661 | 4/2004 |
| JP | 2004-127662 | 4/2004 |
| KR | 10-2004-0019186 | 3/2004 |

* cited by examiner

ELECTROLUMINESCENCE DISPLAY DEVICE WITH MICROLENS

CROSS REFERENCE TO RELATED APPLICATION

This application claims priority to and the benefit of Korean Patent Application No. 10-2005-0016888, filed on Feb. 28, 2005, which is hereby incorporated by reference for all purposes as if fully set forth herein.

BACKGROUND OF THE INVENTION

1. Field of the Invention

The present invention relates to an electroluminescence (EL) display device, and more particularly, to an EL display device with improved external light coupling efficiency and brightness that can be easily manufactured.

2. Discussion of the Background

In an EL display device, the light emitted from a light-emission layer may pass through many layers before being emitted to the outside, and thus some light emitted from the light-emission layer is not emitted outside the device. The external light coupling efficiency $\eta_{ex}$ of an EL display device is given by the following equation:

$$\eta_{ex} = \eta_{in} \cdot \eta_{out}$$

where $\eta_{in}$ represents the internal light coupling efficiency of the EL display device due to self-elimination of light within each layer. Further, $\eta_{out}$ represents the output light coupling efficiency of the EL display device due to the variations in the refractive indexes of the layers and thus, the output light coupling efficiency represents the total internal reflection at the interface of the layers of the device. Specifically, total internal reflection at an interface occurs when the incident angle of a light photon is greater than a critical angle when the light is incident to an interface between a first medium with a higher refractive index to a second medium with a lower refractive index.

The fraction of the light emitted from the emissive layer that is ultimately emitted from the EL display device, defined as the output light coupling efficiency $\eta_{out}$ or the light transmittance efficiency, can be expressed as:

$$\frac{1}{2}\left(\frac{N_{out}}{N_{in}}\right)^2 \quad (2)$$

where $N_{in}$ is the refractive index of the layer from which light is transmitted, and $N_{out}$ is the refractive index of the layer into which the light is entering. For example, the output light coupling efficiency of light transmitting through a layer with a refractive index of about 1.5 to a layer with a refractive index of about 1.2 is determined to be 32% using Equation 2. That is, about 68% of the light which enters the interface is not emitted to the outside.

Because low external light coupling efficiency results in reduced brightness of the EL display device, there have been many attempts to prevent lowered external light coupling efficiency.

One method is to increase the supply voltage to the light-emitting layer. This method leads to improved brightness but requires increased battery capacity. Because increased battery capacity requires increased battery weight, the improved brightness resulting from this method is offset by the negative effect of the increased battery weight. In addition, the life of the battery and the EL element may be shortened. As a result, the following conventional methods have been suggested to improve luminescence while lowering the supply voltage.

Japanese Patent Publication No. hei 4-192290 discloses an inorganic EL device where a plurality of condensing microlenses of the same size or larger than an inorganic EL element are formed on an external surface of a transparent substrate, on which the inorganic EL element is formed. Light incident on the interface between the transparent substrate and air at an angle larger than the critical angle has an incident angle less than the critical angle on the microlenses, thereby reducing total internal reflection. Thus, the light is emitted in a predetermined direction to improve brightness of the device. However, the EL element is a surface light source in the cited invention, and thus diffused light that is not focused inevitably occurs when using a microlens that is the same size or larger than the EL element. In addition, clarity of an image displayed on the device is reduced due to overlapping images produced from adjacent EL elements.

Japanese Patent Publication No. hei 7-037688 discloses an EL element formed on a substrate with a cylindrically-shaped high refraction factor section formed of a material with a higher refraction index than the surrounding material formed around the side surface of the substrate. Light produced by the EL element is emitted through the high-refraction factor section to increase external light coupling efficiency. However, in the cited invention, the light which transmits through the high-refraction factor section is diffused light, as illustrated in FIG. 1 of the Japanese Patent Publication No. hei 7-037688. Thus, the brightness of the light emitted to the front is not significantly improved.

Japanese Patent Publication No. hei 10-172756 discloses an organic EL light emitting device in which one or more condensing lenses are disposed between a lower electrode of the organic EL light emitting device and a transparent substrate. The organic EL light emitting device and the condensing lens are positioned to correspond to each other. Light emitted from the EL light emitting device is incident on an interface of the transparent substrate at an angle smaller than the critical angle to increase the external light coupling efficiency. However, in the cited invention, overlapping images produced by adjacent EL light emitting devices reduce image clarity.

SUMMARY OF THE INVENTION

This invention provides an electroluminescence (EL) display device with improved external light coupling efficiency and brightness that can be easily manufactured.

Additional features of the invention will be set forth in the description which follows, and in part will be apparent from the description, or may be learned by practice of the invention.

The present invention discloses an electroluminescence (EL) display device with a substrate, a first electrode formed on the substrate, a second electrode formed on the first electrode and arranged to face the first electrode, an intermediate layer including an emissive layer where the intermediate layer disposed between the first and second electrodes, a second layer formed on the substrate, and a microlens layer formed on the substrate. The microlens layer is disposed between the second layer and the first electrode when the second layer is formed below the first electrode, and disposed between the second layer and the second electrode when the second layer is formed on the second electrode. Further, the second layer is a color converting layer or a color filter layer.

The present invention also discloses an electroluminescence (EL) display device with a substrate, a first electrode formed on the substrate, a second electrode formed on the first electrode and arranged to face the first electrode, an intermediate layer including an emissive layer where the intermediate layer disposed between the first and second electrodes, a second layer formed on the substrate, a third layer formed on the substrate, a first microlens layer formed on the substrate, and a second microlens layer formed on the substrate. Further, the second layer is a color converting layer or a color filter layer and is disposed between the substrate and the first electrode, and the third layer is a color converting layer or a color filter layer and is disposed above the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
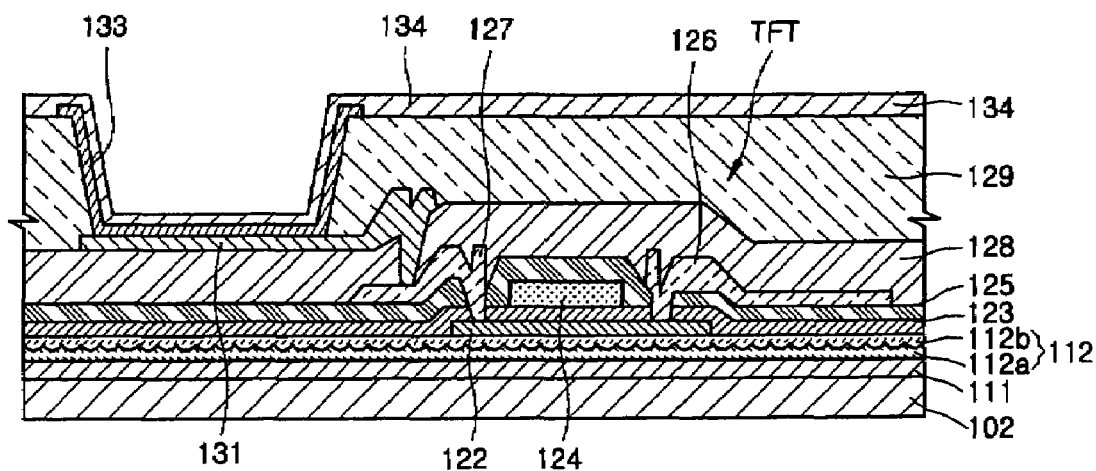
FIG. 1 shows a schematic cross-sectional view of an active matrix electroluminescence (EL) display device according to a first embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals refer to the same or similar components on the various figures.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 shows a schematic cross-sectional view of an active matrix electroluminescence (EL) display device according to a first embodiment of the present invention.

EL display devices can be classified as passive matrix (PM) EL display devices with a simple matrix type or active matrix (AM) EL display devices including a thin film transistor (TFT), depending on a method of controlling the emission of pixels. The EL display device in the present embodiment is the active matrix EL display device.

Referring to FIG. 1, a first electrode 131 is formed on a substrate 102, a second electrode 134 is disposed above the first electrode 131 and faces the first electrode 131, and an intermediate layer 133 with an emissive layer is interposed between the first electrode 131 and the second electrode 134. At least one TFT is coupled with the first electrode 131, and a capacitor may be coupled with the TFT.

The substrate 102 can be formed of transparent glass, acryl, polymide, polycarbonate, polyester, mylar, or other plastic materials. A buffer layer (not shown) made of $SiO_2$ may be disposed on the substrate 102 to maintain a smooth substrate 102 and prevent impurities from penetrating layers that are subsequently formed on the substrate 102 during the fabrication process.

One of the first electrode 131 or the second electrode 134 acts as an anode and the other acts as a cathode.

The EL display device of the present embodiment is a bottom emission EL display device in which light is emitted towards the substrate 102. Therefore, the first electrode 131 is a transparent electrode made of, for example, ITO, IZO, ZnO, or $In_2O_3$. The first electrode 131 can be arranged to correspond to a sub-pixel. The second electrode 134 is a reflective electrode, and can be made by depositing Li, Ca, LiF/Ca, LiF/Al, Al, Mg, or a compound thereof. The second electrode 134 can be disposed to correspond to a sub-pixel or can be disposed over the entire surface of the substrate 102. In other embodiments of active matrix EL displays described below, the EL display device can be configured in the above-described structure in the case of the bottom emission EL display device but is not limited thereto.

As described above, a TFT is coupled with the first electrode 131. The TFT includes a semiconductor layer 122, a gate insulating layer 123 formed on the semiconductor layer 122, and a gate electrode 124 formed on the gate insulating layer 123. The gate electrode 124 is coupled with a gate line (not shown) which supplies an on/off signal to the TFT. A region on which the gate electrode 124 is formed corresponds to a channel region of the semiconductor layer 122. The structure of the TFT is not specifically limited to the one illustrated in FIG. 1 and various TFTs, such as an organic TFT, can be configured.

An inter-insulator 125 is formed on the gate electrode 124, a source electrode 126 is coupled with a source region of the semiconductor layer 122 via a first contact hole, and a drain electrode 127 is coupled with a drain region of the semiconductor layer 122 via a second contact hole.

A planarization layer or a protective layer 128 made of, for example, SiO$_2$ can be formed on the source electrode 126 and the drain electrode 127, and a pixel defining layer 129 made of acryl, polymide, or a similar material can be formed on the protective layer 128.

Although not illustrated in FIG. 1, at least one capacitor can be coupled with the TFT. A circuit with the TFT is not limited to that illustrated in FIG. 1, and can be embodied in various ways.

The drain electrode 127 is coupled with an EL element. The first electrode 131, which can be the anode of the EL element, is formed on the protective layer 128, the pixel defining layer 129 is formed on the protective layer 128, and the intermediate layer 133 including the emissive layer is formed in a predetermined opening in the pixel defining layer 129. In FIG. 1, the intermediate layer 133 is patterned to correspond to only one sub-pixel for convenience of explanation, but the intermediate layer 133 can be integrated with an intermediate layer of adjacent sub-pixels.

The intermediate layer 133 may be composed of organic or inorganic materials. If the intermediate layer 133 is composed of an organic material, the organic material may be a high molecular weight organic material or a low molecular weight organic material. When the low molecular weight organic material is used, a hole injection layer (HIL), a hole transport layer (HTL), an emission layer (EML), an electron transport layer (ETL), and an electron injection is layer (EIL) may be stacked in a single structure or a multiple structure, and the organic material may be copper phthalocyanine (CuPc), N,N'-di(naphthalene-1-yl)-N,N'-diphenyl-benzidine (NPB), or tris-8-hydroxyquinoline aluminum (Alq$_3$). The low molecular weight organic material may be formed, for example, using a vacuum deposition method.

When a high molecular weight organic material is used for the intermediate layer 133, the intermediate layer 133 may include an HTL and an EML. The HTL may be made of poly-3,4-ethylenedioxythiophene (PEDOT) and the EML may be made of high molecular weight organic materials, for example, from the poly-phenylenevinylene (PPV) family or the polyfluorene family.

The structure and materials of the intermediate layer 133 can be applied to other embodiments described below, and variations of the intermediate layer 133 as described with respect to the present embodiment can also be applied to the other embodiments.

The EL element formed on the substrate 102 can be covered by an element (not shown) facing the EL element. The element may be made of glass or a plastic material like the substrate 102, but can also be made of a metal cap.

Layer 111 can be a color converting layer or a color filter layer, and can be disposed at least between the substrate 102 and the first electrode 131 or between the substrate 102 and the second electrode 134. In the EL display device of the present embodiment, a layer 111 is disposed between the substrate 102 and the first electrode 131, as illustrated in FIG. 1. The EL display device of the present embodiment is a bottom emission EL display device in which light emitted from the emissive layer included in the intermediate layer 133 is transmitted to the outside via the substrate 102.

A microlens layer can be disposed between layer 111 and the first electrode 131 if the layer 111 is formed closer to the first electrode 131 than the second electrode 134. Alternatively, the microlens layer can be disposed between the layer 111 and the second electrode 134 if the layer 111 is formed closer to the second electrode 134 than the first electrode 131. In the present embodiment, a microlens layer 112 is disposed between the layer 111 and the first electrode 131. The microlens layer 112 can include a prominence and depression layer 112a and a planarization layer 112b, which smoothes and levels the prominence and depression layer 112a, as illustrated in FIG. 1. The microlens layer 112 can be made of silicon nitride or silicon oxide, but is not limited thereto.

In the EL display device of the present embodiment illustrated in FIG. 1, the microlens layer 112 is formed on the layer 111, but the microlens layer 112 can be formed on a different layer in the device. Specifically, there are many layers disposed between the layer 111 and the first electrode 131, as illustrated in FIG. 1, and thus the microlens layer 112 can be disposed between any two of those layers and is not limited to the formation disclosed in the embodiment illustrated in FIG. 1. The arrangement of a microlens layer in other embodiments, as described below, is similarly unconstrained.

The layer 111 and the microlens layer 112 illustrated in FIG. 1 are disposed throughout the entire EL display device. However, this can be modified in many ways. For example, the color conversion layer or the color filter layer 111 and the microlens layer 112 can correspond to only emitting regions of each of the sub-pixels or can correspond to a predetermined region of some of the pixels. The arrangement of a color conversion layer or the color filter layer and microlens layer in other embodiments, as described below, is similarly unconstrained.

When layer 111 is a color conversion layer 111 and is formed on the substrate 102, the emissive layer included in the intermediate layer 133 can emit monochrome light, and the color conversion layer 111 can convert the light emitted from the emissive layer into a predetermined color of light, such as red, green or blue light. Alternatively, the emissive layer included in the intermediate layer 133 can emit blue light, in which case the color converting layer 111 can convert the blue light into red light or green light, or simply transmit the blue light. Alternatively, when layer 111 is a color filter layer and formed on the substrate 102, the emissive layer included in the intermediate layer 133 can emit white light, and the color filter layer 111 can filter the white light emitted from the emissive layer to transmit only red light, green light, or blue light.

In the EL display device formed as described above, the light emitting from the emissive layer included in the intermediate layer 133 can be diffused light, and thus some light may be emitted towards edges of the EL display device and not towards the substrate 102 of the EL display device. Therefore, a microlens layer 112 arranged on an optical path of the emitted light can focus the light towards a predetermined direction for intended emission via the microlens layer 112, thereby improving luminance of the EL display device.

In the present embodiment, the microlens layer 112 may be formed as a convex lens on the optical path from the intermediate layer 133, in which the emissive layer is included, to the substrate 102, as illustrated in FIG. 1. Further, the refractive index of the planarization layer 112b, (i.e. the upper portion of the microlens layer 112), is greater than the refractive index of the prominence and depression layer 112a, (i.e. the lower portion of the microlens layer 112). Alternatively, the microlens layer 112 may be formed as a concave lens on the optical path from the intermediate layer 133, in which the emissive layer is included, to the substrate 102, unlike the microlens layer 112 illustrated in FIG. 1. In this case, the refractive index of an upper portion of the microlens layer 112 among layers comprising the microlens layer 112 is greater than the refractive index of a lower portion of the microlens layer 112. In a convex arrangement or concave arrangement of the microlens layer as described, focusing light towards the emission surface, the substrate 102 in FIG. 1, can be achieved through appropriate selection of materials with relative refractive indices for the described layers.

Figure 2:
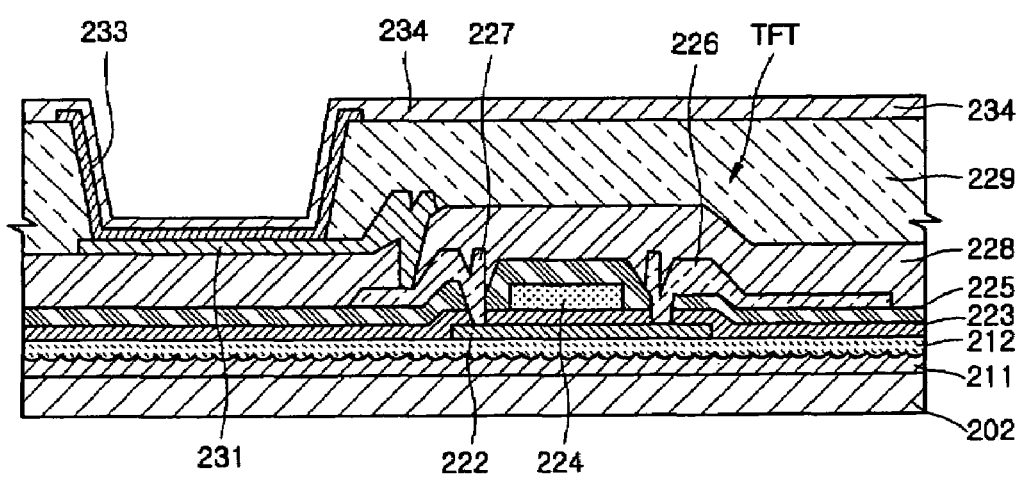
FIG. 2 shows a schematic cross-sectional view of an active matrix EL display device according to a second embodiment of the present invention.

FIG. 2 shows a schematic cross-sectional view of an active matrix EL display device according to a second embodiment of the present invention.

Referring to FIG. 2, a first electrode 231 is formed on a substrate 202, a second electrode 234 facing the first electrode 231 is disposed above the first electrode 231, and an intermediate layer 233 including an emissive layer is interposed between the first and second electrodes 231 and 234. At least one TFT can be coupled with the first electrode 231, and a capacitor may be coupled with the TFT.

As illustrated in FIG. 2, a color converting layer or a color filter layer 211 is disposed between the substrate 202 and the first electrode 231. A microlens layer 212 is disposed between the layer 211 and the first electrode 231.

A TFT is coupled with the first electrode 231. The TFT includes a semiconductor layer 222, a gate insulating layer 223 formed on the semiconductor layer 222, and a gate electrode 224 formed on the gate insulating layer 223. An inter-insulator 225 is formed on the gate electrode 224, a source electrode 226 is coupled with a source region of the semiconductor layer 222 via a first contact hole, and a drain electrode 227 is coupled with a drain region of the semiconductor layer 222 via a second contact hole. A planarization layer or a protective layer 228 made of, for example, SiO$_2$ can be formed on the source electrode 226 and the drain electrode 227, and a pixel defining layer 229, made of acryl, polyamide, or a similar material can be formed on the protective layer 228.

The EL display device of the present embodiment is different from the EL display device of the first embodiment in that the microlens layer 112 in the EL display device of the first embodiment includes two layers, the prominence and depression layer 112a and the planarization layer 112b, and the top and bottom surfaces of the microlens layer 112 are smooth. However, a microlens layer 212 in the EL display device of the present embodiment is formed of a single layer with protrusions formed on the bottom surface thereof. Further, a top surface of a color converting layer or a color filter layer 211 is formed under the microlens layer 212 with a non-level surface that corresponds to the bottom surface of the microlens layer 212.

When light is incident on a plurality of interfaces between layers, total internal reflection does not occur unless the light is incident from a medium having a higher refractive index to a medium having a lower refractive index. However, a portion of light incident on such interfaces can be reflected even if total internal reflection does not occur, and thus the amount of light emitted to the outside is reduced. Therefore, the EL display device of the second embodiment, including the microlens layer 212, can improve external light coupling efficiency as well as brightness by reducing the number of interfaces the light emitted from an intermediate layer 233 passes through before being transmitted externally.

Figure 3:
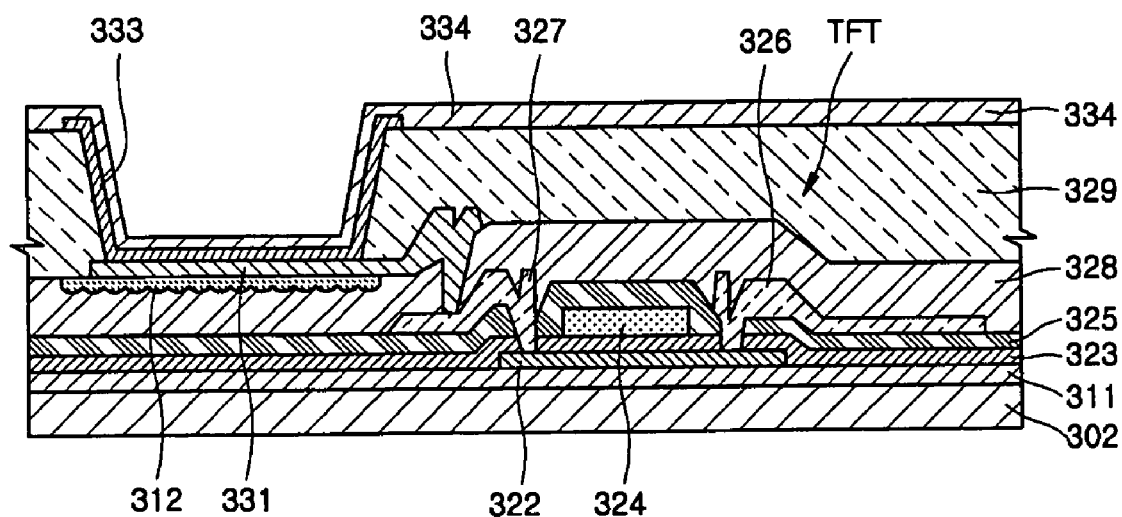
FIG. 3 shows a schematic cross-sectional view of an active matrix EL display device according to a third embodiment of the present invention.

FIG. 3 shows a schematic cross-sectional view of an active matrix EL display device according to a third embodiment of the present invention.

Referring to FIG. 3, a first electrode 331 is formed on a substrate 302, a second electrode 334 is disposed above the first electrode 331 and faces the first electrode 331, and an intermediate layer 333 including an emissive layer is interposed between the first electrode 331 and the second electrode 334. At least one TFT is coupled with the first electrode 331, and a capacitor may be coupled with the TFT.

As illustrated in FIG. 3, a color converting layer or a color filter layer 311 is disposed between the substrate 302 and the first electrode 331. A microlens layer 312 is disposed between the layer 311 and the first electrode 331.

A TFT is coupled with the first electrode 331. The TFT includes a semiconductor layer 322, a gate insulating layer 323 formed on the semiconductor layer 322, and a gate electrode 324 formed on the gate insulating layer 323. An inter-insulator 325 is formed on the gate electrode 324, a source electrode 326 is coupled with a source region of the semiconductor layer 322 via a first contact hole, and a drain electrode 327 is coupled with a drain region of the semiconductor layer 322 via a second contact hole. A planarization layer or a protective layer 328 made of, for example, SiO$_2$ can be formed on the source electrode 326 and the drain electrode 327, and a pixel defining layer 329, made of acryl, polyamide, or a similar material can be formed on the protective layer 328.

The EL display device of the present embodiment is different from the EL display devices of the first and second embodiments in that the color converting layers or the color filter layers 111 and 211 in the EL display devices of the first and second embodiment are respectively formed on the substrates 102 and 202 and the microlens layers 112 and 212 are respectively formed on the color filter layers 111 and 211. However, first electrode 331 in the EL display device of the present embodiment is formed on the microlens layer 312.

In the case of a bottom emission EL display device, the refractive index of the first electrode 331 can be about 1.9, which is greater than the refractive index of layers formed below the first electrode 331, which can be about 1.5. Therefore, when light emitted from the intermediate layer 333 in which the emissive layer is included is emitted to the outside by passing through the first electrode 331, the light can be totally internally reflected by an interface of the first electrode 331 and the layer positioned below the first electrode 331, thereby lowering outside coupling efficiency. Therefore, by forming the first electrode 331 on the microlens layer 312, external light coupling efficiency can be increased by selecting a material for the microlens layer 312 with a refractive index that is equal or larger than the refractive index of the material selected for the first electrode 331. Thus, total internal reflection at the interface of the first electrode 331 and the microlens layer 312 can be avoided.

As illustrated in FIG. 3, the microlens layer 312 is a single layer, and a top surface of a protective layer 328 formed under the bottom surface of the microlens layer 312 has curves thereon corresponding to protrusions on the bottom surface of the microlens layer 312. Additionally, the microlens layer 312 of the present embodiment can be configured like the microlens layer 112 of the first embodiment with two layers, the prominence and depression layer 112a and the planarization layer 112b as illustrated in FIG. 1.

The EL display device having the above described structure can prevent occurrence of total internal reflection of the light emitted from the emissive layer at an interface of the first electrode 331 and the layer positioned below the first electrode 331. As a result, the external light coupling efficiency and brightness can be improved.

The EL display device of the present embodiment includes first electrode 331 formed on the microlens layer, and the layer 311 disposed apart from the microlens layer 312.

Figure 4:
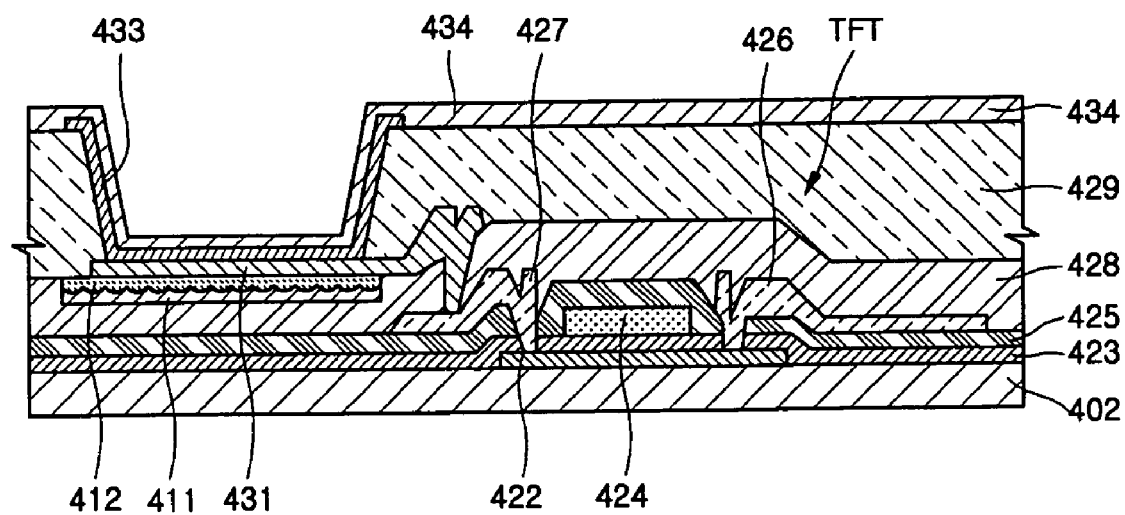
FIG. 4 shows a schematic cross-sectional view of an active matrix EL display device according to a fourth embodiment of the present invention.

FIG. 4 shows a schematic cross-sectional view of an active matrix EL display device according to a fourth exemplary embodiment of the present invention.

Referring to the fourth exemplary embodiment, shown in FIG. 4, a first electrode 431 is formed on a substrate 402, a second electrode 434 facing the first electrode 431 is disposed above the first electrode 431, and an intermediate layer 433 including an emissive layer is interposed between the first electrode 431 and the second electrode 434.

The microlens layer 412 of the present exemplary embodiment is formed of a single layer with protrusions formed on the bottom surface thereof. A top surface of a color converting layer 411 is formed under the microlens layer 412 with a non-level surface that corresponds to the bottom surface of the microlens layer 412.

A TFT is coupled with the first electrode 431. The TFT includes a semiconductor layer 422, a gate insulating layer 423 formed on the semiconductor layer 422, and a gate electrode 424 formed on the gate insulating layer 423. An inter-insulator 425 is formed on the gate electrode 424, a source electrode 426 is coupled with a source region of the semiconductor layer 422 via a first contact hole, and a drain electrode 427 is coupled with a drain region of the semiconductor layer 422 via a second contact hole. A planarization layer or a protective layer 428 made of, for example, $SiO_2$ can be formed on the source electrode 426 and the drain electrode 427, and a pixel defining layer 429, made of acryl, polyamide, or a similar material can be formed on the protective layer 428.

Figure 5:
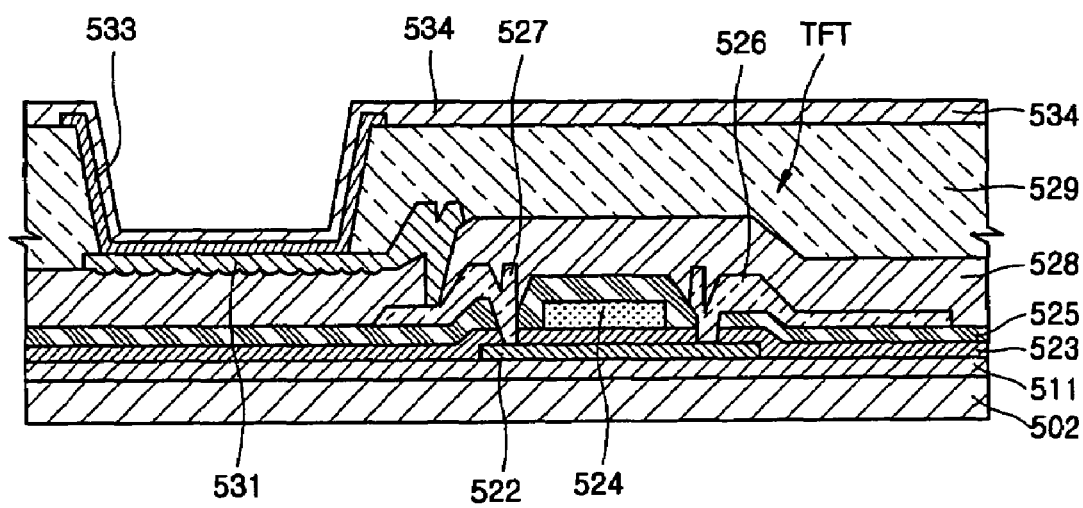
FIG. 5 shows a schematic cross-sectional view of an active matrix EL display device according to a fifth embodiment of the present invention.

FIG. 5 shows a schematic cross-sectional view of an active matrix EL display device according to a fifth embodiment of the present invention.

Referring to FIG. 5, a first electrode 531 is formed on a substrate 502, a second electrode 534 facing the first electrode 531 is disposed above the first electrode 531, and an intermediate layer 533 including an emissive layer is interposed between the first electrode 531 and the second electrode 534. At least one TFT is coupled with the first electrode 531, and a capacitor may be further coupled with the TFT.

As illustrated in FIG. 5, a color converting layer or a color filter layer 511 is disposed between the substrate 502 and the first electrode 531. A microlens layer is disposed between a color converting layer or a color filter layer 511 and the first electrode 531.

The TFT includes a semiconductor layer 522, a gate insulating layer 523 formed on the semiconductor layer 522, and a gate electrode 524 formed on the gate insulating layer 523. An inter-insulator 525 is formed on the gate electrode 524, a source electrode 526 is coupled with a source region of the semiconductor layer 522 via a first contact hole, and a drain electrode 527 is coupled with a drain region of the semiconductor layer 522 via a second contact hole. A planarization layer or a protective layer 528, made of, for example, $SiO_2$ can be formed on the source electrode 526 and the drain electrode 527, and a pixel defining layer 529, made of acryl, polyamide, or a similar material can be formed on the protective layer 528.

The EL display device of the present embodiment is different from the EL display devices of the first through fourth embodiments in that the microlens layers 121, 221, 312, and 412 and in the EL display devices of the first through fourth embodiments are formed separately from the first electrodes 131, 231, 331, and 431, respectively. However, in the case of the EL display device of the fifth embodiment, a microlens layer is not formed separately. Rather, a microlens layer is formed integrated with a lower surface of the first electrode 531, facing the substrate 502.

In the EL display device of the fifth embodiment, the microlens layer formed integrated with the first electrode 531 can have a higher refractive index than the first electrode 531. Thus, light emitted from the intermediate layer 533 is not totally internally reflected at the interface of the first electrode 531 and the microlens layer formed integrated with the lower surface of the first electrode 531. In addition, by reducing the number of interfaces transmitted light must pass through before emission from the display device, the external light coupling efficiency and brightness of the EL display device are improved.

Figure 6:
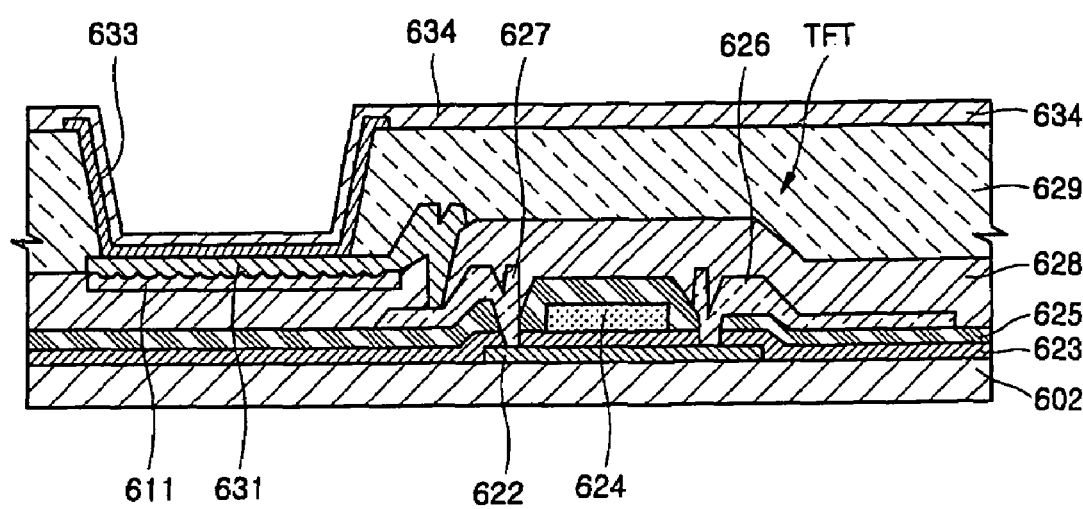
FIG. 6 shows a schematic cross-sectional view of an active matrix EL display device according to a sixth embodiment of the present invention.

FIG. 6 shows a schematic cross-sectional view of an active matrix EL display device according to a sixth embodiment of the present invention.

Referring to FIG. 6, a first electrode 631 is formed on a substrate 602, a second electrode 634 facing the first electrode 631 is disposed above the first electrode 631, and an intermediate layer 633 including an emissive layer is interposed between the first electrode 631 and second electrode 634. At least one TFT is coupled with the first electrode 631, and a capacitor may be coupled with the TFT.

As illustrated in FIG. 6, a color converting layer or a color filter layer 611 is positioned between the substrate 602 and the first electrode 631, and a microlens layer is positioned between a color converting layer or a color filter layer 611 and the first electrode 631.

The TFT includes a semiconductor layer 622, a gate insulating layer 623 formed on the semiconductor layer 622, and a gate electrode 624 formed on the gate insulating layer 623. An inter-insulator 625 is formed on the gate electrode 624, a source electrode 626 is coupled with a source region of the semiconductor layer 622 via a first contact hole, and a drain electrode 627 is coupled with a drain region of the semiconductor layer 622 via a second contact hole. A planarization layer or a protective layer 628 made of, for example, $SiO_2$ can be formed on the source electrode 626 and the drain electrode 627, and a pixel defining layer 629, made of acryl, polyamide, or a similar material can be formed on the protective layer 628.

The EL display device of the sixth embodiment is similar to the EL display device of the fifth embodiment in that the EL display device of the sixth embodiment does not include a separate microlens layer, but instead a lens is formed integrated with a lower surface of the first electrode 631, facing the substrate 602.

The EL display device of the present embodiment is different from that of the fifth embodiment in that the layer 511 of the EL display device of the fifth embodiment is disposed at a distance from the first electrode 531. However, the layer 611 of the EL display device of the present embodiment is formed to contact the bottom surface of the first electrode 631, and the first electrode 631 is formed integrated with a microlens. According to such a structure, a thinner EL display device can be configured while still achieving improved brightness and external light coupling efficiency of the EL display device.

Figure 7:
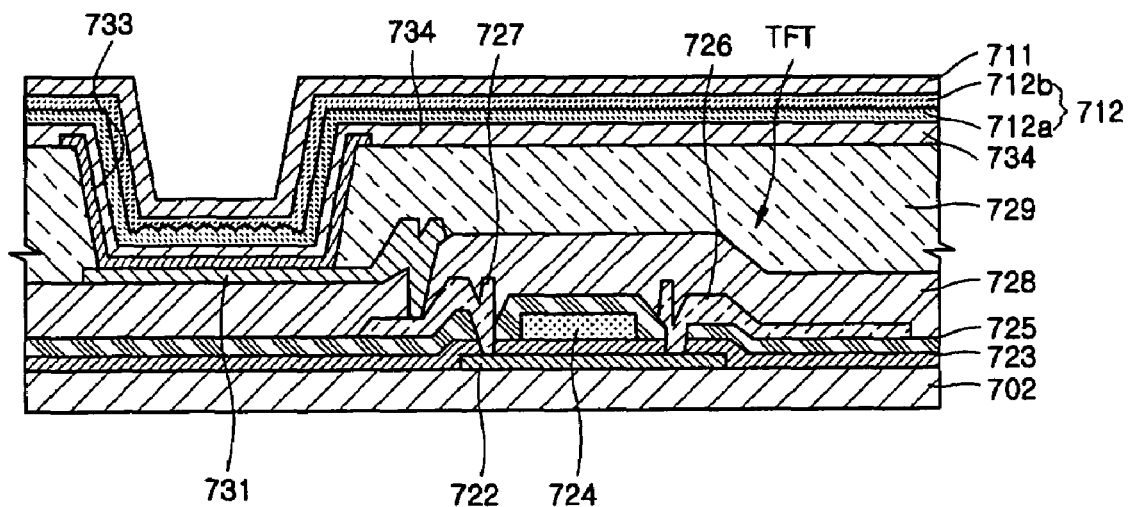
FIG. 7 shows a schematic cross-sectional view of an active matrix EL display device according to a seventh embodiment of the present invention.

FIG. 7 shows a schematic cross-sectional view of an active matrix EL display device according to a seventh embodiment of the present invention.

Referring to FIG. 7, a first electrode 731 is formed on a substrate 702, a second electrode 734 facing the first electrode 731 is disposed above the first electrode 731, and an intermediate layer 733 including an emissive layer is interposed between the first electrode 731 and second electrode 734. At least one TFT is coupled with the first electrode 731, and a capacitor may be coupled with the TFT.

The TFT includes a semiconductor layer 722, a gate insulating layer 723 formed on the semiconductor layer 722, and a gate electrode 724 formed on the gate insulating layer 723. An inter-insulator 725 is formed on the gate electrode 724, a source electrode 626 is coupled with a source region of the semiconductor layer 722 via a first contact hole, and a drain electrode 727 is coupled with a drain region of the semiconductor layer 722 via a second contact hole. A planarization layer or a protective layer 728 made of, for example, $SiO_2$ can be formed on the source electrode 726 and the drain electrode 727, and a pixel defining layer 729, made of acryl, polyamide, or a similar material can be formed on the protective layer 728.

The EL display device of the present embodiment is different from that of the first through sixth embodiments in that the EL display device of the present embodiment is a top emission EL display device in which light emitted from the intermediate layer 733 including the emissive layer is emitted to the outside via the second electrode 734 formed on the intermediate layer 733.

Therefore, in the EL display device according to the present embodiment, the first electrode 731 is a reflective electrode and the second electrode 734 is a transparent electrode. Thus, the first electrode 731 can be formed by forming a reflective layer using Ag, Mg, Al, Pt, Pd, Au, Ni, Nd, Ir, Cr, or a compound thereof, and then forming ITO, IZO, ZnO, or $In_2O_3$ on the resultant structure. The first electrode 731 can be positioned to correspond to a sub-pixel. The second electrode 734 can be formed by depositing Li, Ca, LiF/Ca, LiF/Al, Al, Mg, or a compound thereof, towards the intermediate layer 733 and then forming a supplementary electrode layer or a bus electrode line (not shown) using materials for forming a transparent electrode such as ITO, IZO, ZnO, or $In_2O_3$ on the resultant structure. The second electrode 734 can be positioned to correspond to a sub-pixel or can be positioned over the entire surface of the substrate 702. In other embodiments of top emission EL display devices as described below, the electrodes of the EL display device can be similarly configured as described for the seventh embodiment.

A color converting layer or a color filter layer 711 is formed on the second electrode 734 since the EL display device according to the present embodiment is a top emission EL display device. A microlens layer 712 is positioned between the second electrode 734 and the layer 711.

The microlens layer 712 may be formed as a convex lens on an optical path from the intermediate layer 733 including the emissive layer on the second electrode 734 and may include a lower layer 712a and an upper layer 712b, as illustrated in FIG. 7. With this structure, improved light coupling efficiency can be achieved by selecting a material for the upper layer 712b with a refractive index that is less than the refractive index of the lower layer 712a. Alternatively, the microlens layer 712 may be formed as a concave lens on the optical path from the intermediate layer 733 including the emissive layer to the second electrode 734. With this structure, the refractive index of the upper layer 712b should be greater than the refractive index of the lower layer 712a to achieve the same effect. One of the two structures described here may be more advantageous to manufacture if production can be increased or manufacturing costs can be decreased for one structure with respect to the other.

Figure 8:
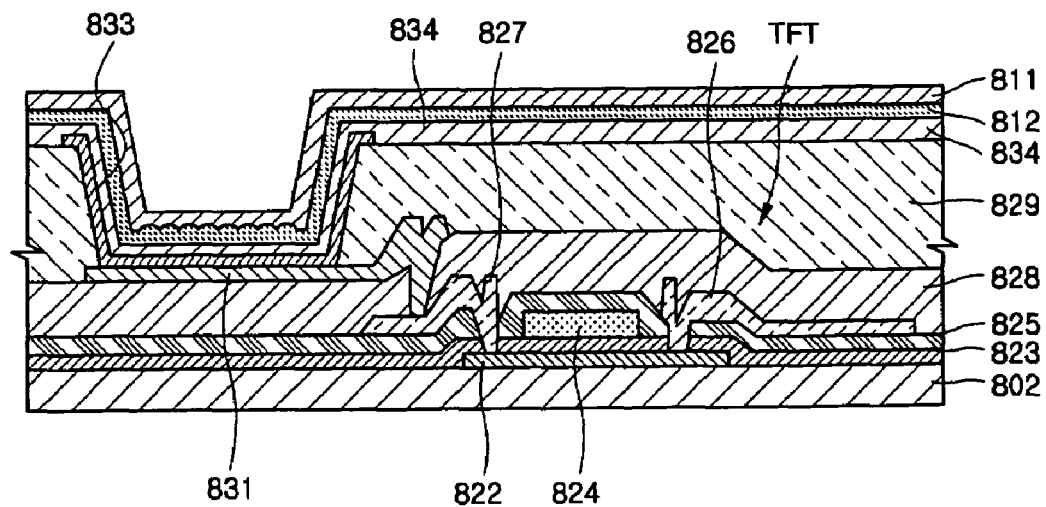
FIG. 8 shows a schematic cross-sectional view of an active matrix EL display device according to an eighth embodiment of the present invention.

FIG. 8 shows a schematic cross-sectional view of an active matrix EL device according to an eighth embodiment of the present invention.

A first electrode 831 is formed on a substrate 802, a second electrode 834 facing the first electrode 831 is disposed above the first electrode 831, and an intermediate layer 833 including an emissive layer is interposed between the first electrode 831 and the second electrode 834.

A TFT is coupled with the first electrode 831. The TFT includes a semiconductor layer 822, a gate insulating layer 823 formed on the semiconductor layer 822, and a gate electrode 824 formed on the gate insulating layer 823. An inter-insulator 825 is formed on the gate electrode 824, a source electrode 826 is coupled with a source region of the semiconductor layer 822 via a first contact hole, and a drain electrode 827 is coupled with a drain region of the semiconductor layer 822 via a second contact hole. A planarization layer or a protective layer 828 made of, for example, $SiO_2$ can be formed on the source electrode 826 and the drain electrode 827, and a pixel defining layer 829, made of acryl, polyamide, or a similar material can be formed on the protective layer 828.

In an active matrix EL display device according to an eighth embodiment illustrated in FIG. 8, a microlens layer 812 is formed as a single layer. Curves, which correspond to protrusions on the top surface of the microlens layer 812, are formed integrated with the layer 811 to reduce the number of interfaces through which light must pass to be emitted to the outside.

Figure 9:
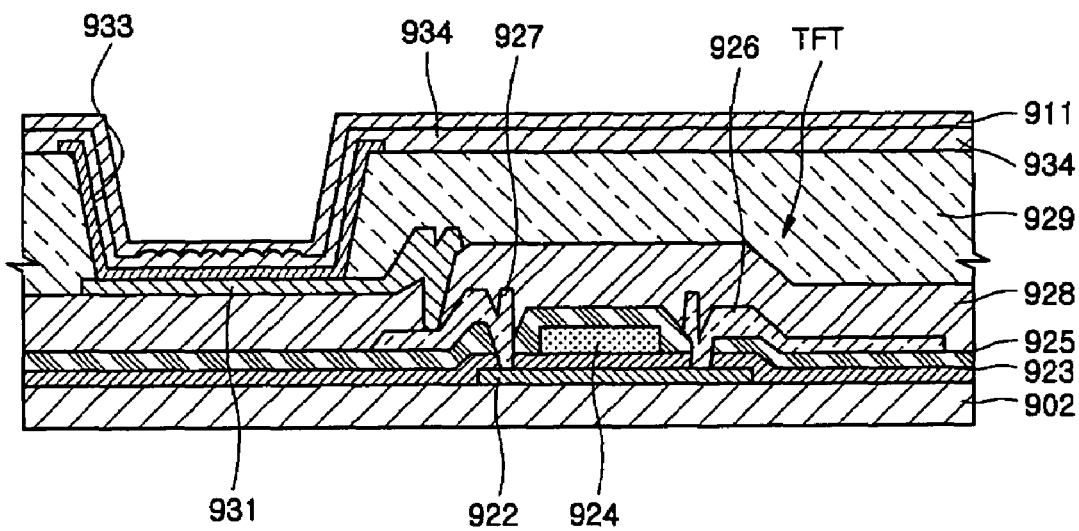
FIG. 9 shows a schematic cross-sectional view of an active matrix EL display device according to a ninth embodiment of the present invention.

FIG. 9 shows a schematic cross-sectional view of an active matrix EL display device according to a ninth embodiment of the present invention.

A first electrode 931 is formed on a substrate 902, a second electrode 934 facing the first electrode 931 is disposed above the first electrode 931, and an intermediate layer 933 including an emissive layer is interposed between the first electrode 931, and the second electrode 934.

A TFT is coupled with the first electrode 931. The TFT includes a semiconductor layer 922, a gate insulating layer 923 formed on the semiconductor layer 922, and a gate electrode 924 formed on the gate insulating layer 923. An inter-insulator 925 is formed on the gate electrode 924, a source electrode 926 is coupled with a source region of the semiconductor layer 922 via a first contact hole, and a drain electrode 927 is coupled with a drain region of the semiconductor layer 922 via a second contact hole. A planarization layer or a protective layer 928 made of, for example, $SiO_2$ can be formed on the source electrode 926 and the drain electrode 927, and a pixel defining layer 929, made of acryl, polyamide, or a similar material can be formed on the protective layer 928.

The external light coupling efficiency and brightness can be improved by forming a microlens integrated with a second electrode 934, without including a separate microlens layer, as in an active matrix EL display device according to a ninth embodiment illustrated in FIG. 9. Curves, which correspond to protrusions on the top surface of the second electrode 934, are formed integrated with layer 911.

Figure 10:
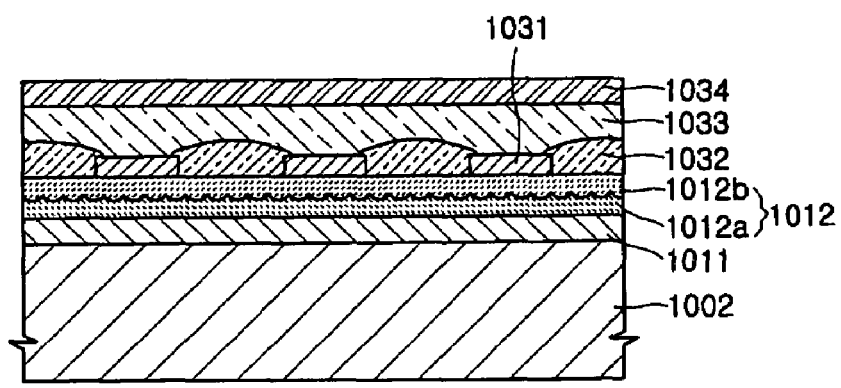
FIG. 10 shows a schematic cross-sectional view of a passive matrix EL display device according to a tenth embodiment of the present invention.

FIG. 10 shows a schematic cross-sectional view of a passive matrix EL display device according to a tenth embodiment of the present invention.

Referring to FIG. 10, a first electrode 1031 is formed on a substrate 1002, a second electrode 1034 facing the first electrode 1031 is disposed above the first electrode 1031, and an intermediate layer 1033 including an emissive layer is interposed between a first electrode 1031 and the second electrode 1034. A buffer layer (not shown) made of, for example, $SiO_2$, may be formed on top of the substrate 1002 to maintain a smooth surface of the substrate 1002 and to prevent penetration of impurities during fabrication.

A layer 1011 can be disposed between the substrate 1002 and the first electrode 1031, or can be disposed over the second electrode 1034. The EL display device of the present embodiment is a bottom emission EL display device in which light emitted from the emissive layer included in the intermediate layer 1033 is transmitted to the outside via the substrate 1002. Therefore, in the present embodiment, the layer 1011 is disposed between the substrate 1002 and the first electrode 1031, as illustrated in FIG. 10.

A microlens layer 1012, with upper microlens layer 1012b and lower microlens layer 1012a, is disposed between the first electrode 1031 and the layer 1011. The microlens layer 1012 can have a structure as illustrated in FIG. 10 or can be modified as described in previous embodiments of the bottom-emission active matrix EL display devices. For example, as described with respect to the fifth and sixth embodiments, a first electrode and the microlens layer can be formed to be integrated. As applied to this embodiment, the first electrode 1031 can be formed integrated with a microlens layer.

The EL display device of the present embodiment is different from the EL display devices of the previous embodiments in that the EL display device of the present embodiment is a passive matrix EL display device. In EL display devices with active matrix displays, at least one TFT in the EL element controls the luminance of each sub-pixel. However, the EL display device of the present embodiment of a passive matrix display type controls luminance of each sub-pixel using the first electrodes 1031 and the second electrode 1034, which are arranged in a predetermined pattern, such as stripes.

In the EL display device of the present embodiment, the first electrode 1031 is formed on the substrate 1002 in a predetermined pattern, such as stripes. An insulating layer 1032 may be formed on the substrate 1002 between stripes of the first electrode 1031. Thereafter, the intermediate layer 1033 including the emissive layer and the second electrode 1034 are sequentially formed on the first electrode 1031. A second electrode 1034 may be formed in a pattern which crosses with the first electrode 1031 at a right angle. Although not illustrated in FIG. 10, a separate insulating layer may be further formed in a pattern which crosses the first electrode 1031 at a right angle for the pattern of the second electrode 1034. In the EL display device described above, the structures and materials of the first electrode 1031, second electrode 1034, and the intermediate layer 1033 can be as described in previous embodiments.

The external light coupling efficiency and brightness of the passive matrix EL display device constructed as above can be improved by including a microlens layer or a first electrode including the microlens described above.

Figure 11:
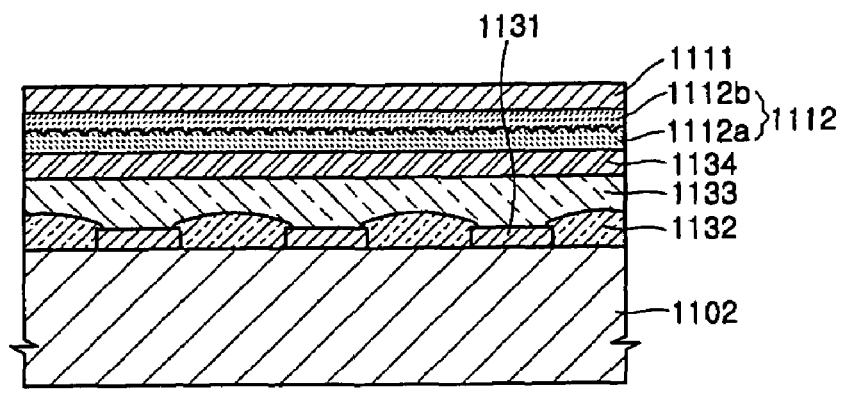
FIG. 11 shows a schematic cross-sectional view of a passive matrix EL display device according to an eleventh embodiment of the present invention.

Also, the microlens layers or the second electrodes with which the microlenses may be integrally formed, as described in the previous embodiments can be included in the passive matrix EL displaying apparatus of a bottom-emission type illustrated in FIG. 10 as well as a top-emission passive matrix EL displaying apparatus illustrated in FIG. 11.

FIG. 11 shows a schematic cross-sectional view of a passive matrix EL display device according to an eleventh embodiment of the present invention.

The EL display of the present embodiment is a top-emission passive matrix EL display device. A first electrode 1131 is formed on a substrate 1102, a second electrode 1134 facing the first electrode 1131 is disposed above the first electrode 1131, and an intermediate layer 1133 including an emissive layer is interposed between the first electrode 1131, and the second electrode 1134. A layer 1111 can be disposed over the second electrode 1134. An insulating layer 1132 may be formed on the substrate 1102 between stripes of the first electrode 1131.

The microlens 1112, including the upper microlens layer 1112b and the lower microlens layer 1112a, of the EL element is positioned between the emissive layer of the intermediate layer 1133 and the color converting layers or the color filter layers 1111 described in the previous embodiments, and through this, a finer image can be displayed.

If the light emitted from the emissive layer is transmitted through the layer to form an image and then concentrated via the microlens, an effective pixel size through the microlens is greater than the actual pixel size as seen by an observer from the outside. If the effective pixel size is excessively large, images of adjacent pixels overlap, thereby reducing clarity. Therefore, an image formed using the focused light can be more clearly shown by positioning the microlens between the emissive layer of the EL elements and the color converting layers or the color filter layers as shown and described in the EL display devices of the previous embodiments.

Additionally, although not illustrated in the drawings, the present invention can be applied to an EL display device known as a dual emission EL display device, in which light emitted from an emissive layer is emitted to the outside via both sides of the emissive layer. Such an embodiment would combine elements of the top-emission EL display device, such as a microlens and color converting layers or the color filter layers positioned above the emissive layer, and the elements of the bottom-emission EL display device, such as a microlens and color converting layers or the color filter layers positioned below the emissive layer but above the substrate.

Thus, according to an EL display device of the present invention, the following can be achieved.

First, by disposing a microlens layer between a color converting layer or a color filter layer and an emissive layer of an EL element, external light coupling efficiency and brightness of the EL display device can be improved.

Second, by forming a microlens on a surface of an electrode of the EL element, the number of interfaces through which light passes before being emitted to the outside can be reduced, thereby improving external light coupling efficiency and brightness of the EL display device.

Third, by disposing the microlens between the emissive layer of the EL element and the color converting layer or the color filter layer, an image is formed using the focused light, and thus a clearer image is displayed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electroluminescence (EL) display device, comprising:

a substrate;

a first electrode formed on the substrate;

a second electrode formed on the first electrode and arranged to face the first electrode;

an intermediate layer including an emissive layer, the intermediate layer disposed between the first electrode and the second electrode;

a first layer which is a color converting layer or a color filter layer, and which is formed between the substrate and the first electrode; and a microlens layer formed on the substrate, and disposed between the first layer and the first electrode, the microlens layer comprising protrusions to focus light toward an emission surface, wherein the first layer planarizes the microlens layer or the microlens layer planarizes the first layer.

2. The EL display device of claim 1, wherein the emissive layer emits blue light.

3. The EL display device of claim 1, wherein the first layer is a color converting layer for converting light emitted from the emissive layer into red, green, or blue light.

4. The EL display device of claim 1, wherein the emissive layer emits white light.

5. The EL display device of claim 1, wherein the first layer is a color filter layer for filtering light emitted from the emissive layer to transmit red, green, or blue light through the color filter layer.

6. The EL display device of claim 1, wherein the first electrode is formed on the microlens layer.

7. The EL display device of claim 6, wherein a refractive index of a material for the microlens layer is equal to or higher than a refractive index of a material for the first electrode.

8. The EL display device of claim 6, wherein the first electrode is formed integrated with the microlens layer.

9. The EL display device of claim 1, wherein a microlens of the microlens layer is a convex lens.

10. The EL display device of claim 1, wherein the microlens layer is formed of silicon nitride or silicon oxide.

11. An electroluminescence (EL) display device, comprising:

a substrate;

a first electrode formed on the substrate;

a second electrode formed on the first electrode and arranged to face the first electrode;

an intermediate layer including an emissive layer, the intermediate layer disposed between the first electrode and the second electrode;

a first layer which is a color converting layer or a color filter layer, and which is disposed between the substrate and the first electrode;

a second layer which is a color converting layer or a color filter layer, and which is disposed above the second electrode;

a first microlens layer comprising protrusions and formed under the first electrode; and a second microlens layer formed over the second electrode, wherein the first layer planarizes the first microlens layer or the first microlens layer planarizes the first layer.

12. The EL display device of claim 11, wherein a lower surface of the first electrode is disposed directly on the first microlens layer, and the second microlens layer is disposed directly on an upper surface of the second electrode.

13. The EL display device of claim 12, wherein a refractive index of a material for the first microlens layer is equal to or higher than a refractive index of a material for the first electrode, and a refractive index of a material for the second microlens layer is equal to or higher than a refractive index of a material for the second electrode.

14. The EL display device of claim 12, wherein the first electrode is formed integrated with the first microlens layer, and the second microlens layer is formed integrated with the upper surface of the second electrode.

15. The EL display device of claim 11, wherein the second microlens layer comprises protrusions, and the second layer planarizes the second microlens layer or the second microlens layer planarizes the second layer.

16. The EL display device of claim 11, wherein a microlens of the microlens layer is a convex lens.

* * * * *